(12) United States Patent
Wei et al.

(10) Patent No.: US 12,278,123 B2
(45) Date of Patent: Apr. 15, 2025

(54) SEMICONDUCTOR PROCESSING APPARATUS

(71) Applicant: BEIJING NAURA MICROELECTRONICS EQUIPMENT CO., LTD., Beijing (CN)

(72) Inventors: Jingfeng Wei, Beijing (CN); Qing She, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 186 days.

(21) Appl. No.: 17/918,077

(22) PCT Filed: Apr. 1, 2021

(86) PCT No.: PCT/CN2021/084860
§ 371 (c)(1),
(2) Date: Oct. 10, 2022

(87) PCT Pub. No.: WO2021/204050
PCT Pub. Date: Oct. 14, 2021

(65) Prior Publication Data
US 2023/0162998 A1    May 25, 2023

(30) Foreign Application Priority Data

Apr. 10, 2020    (CN) .......................... 202020527685.6

(51) Int. Cl.
H01L 21/67    (2006.01)
C23C 16/54    (2006.01)
H01L 21/677   (2006.01)

(52) U.S. Cl.
CPC ........ *H01L 21/67167* (2013.01); *C23C 16/54* (2013.01); *H01L 21/67184* (2013.01);
(Continued)

(58) Field of Classification Search
CPC ......... H01L 21/67167; H01L 21/67184; H01L 21/67201; H01L 21/67742;
(Continued)

(56) References Cited

U.S. PATENT DOCUMENTS 5,186,718 A      2/1993 Tepman et al.
2007/0107845 A1  5/2007 Ishizawa et al.
(Continued)

FOREIGN PATENT DOCUMENTS

CN    103208441 A    7/2013
CN    103700605 A    4/2014
(Continued)

OTHER PUBLICATIONS

The World Intellectual Property Organization (WIPO) International Search Report for PCT/CN2021/084860 Jun. 29, 2021 6 Pages (including translation).

*Primary Examiner* — Glenn F Myers
(74) *Attorney, Agent, or Firm* — ANOVA LAW GROUP, PLLC

(57) ABSTRACT

The present disclosure discloses a semiconductor processing apparatus, which is configured to perform processing on a wafer. The disclosed semiconductor processing apparatus includes a vacuum interlock chamber, a plurality of apparatus bodies, the apparatus body including a transfer platform, and at least two reaction chambers being arranged along a circumferential direction of the transfer platform, and a temporary storage channel, any two neighboring apparatus bodies being communicated through the temporary storage channel, and the temporary storage channel
(Continued)

being configured to temporarily store the wafer. One of the plurality apparatus bodies is connected to the vacuum interlock chamber. The transfer platform is configured to transfer the wafer between the vacuum interlock chamber and the reaction chamber, between the temporary storage channel and the vacuum interlock chamber, and between the temporary storage channel and the reaction chamber. With the above solution, the problem that the productivity of the semiconductor processing apparatus is low is solved.

11 Claims, 2 Drawing Sheets

(52) U.S. Cl.
CPC .. *H01L 21/67201* (2013.01); *H01L 21/67742* (2013.01); *H01L 21/67769* (2013.01)

(58) Field of Classification Search
CPC ......... H01L 21/67769; H01L 21/67207; H01L 21/67213; H01L 21/67739; H01L 21/67748; H01L 21/68707; H01L 21/6875; H01L 21/68771
See application file for complete search history.

(56) References Cited

U.S. PATENT DOCUMENTS

| | | | | |
|---|---|---|---|---|
| 2019/0088540 A1* | 3/2019 | Hou | .................. | H01L 21/02697 |
| 2019/0259628 A1* | 8/2019 | Bai | ..................... | H01L 21/6719 |
| 2020/0227294 A1* | 7/2020 | Zhu | ................... | H01L 21/67167 |
| 2020/0321227 A1* | 10/2020 | Toyomaki | ......... | H01L 21/67155 |
| 2021/0028044 A1* | 1/2021 | Vellore | ............. | H01L 21/67383 |

FOREIGN PATENT DOCUMENTS

| | | | | | |
|---|---|---|---|---|---|
| CN | 103765571 A | | 4/2014 | | |
| CN | 211879343 U | | 11/2020 | | |
| JP | 2003059999 A | | 2/2003 | | |
| JP | 2003203963 A | | 7/2003 | | |
| JP | 2005197752 A | | 7/2005 | | |
| JP | 2009124078 A | | 6/2009 | | |
| JP | 20124381 A | | 1/2012 | | |
| JP | 2012204698 A | * | 10/2012 | ........ | H01L 21/67173 |
| JP | 2013251420 A | | 12/2013 | | |
| JP | 2014086487 A | | 5/2014 | | |
| JP | 2015191932 A | | 11/2015 | | |
| KR | 20170017538 A | | 2/2017 | | |
| WO | 2006137370 A1 | | 12/2006 | | |
| WO | 2015066624 A1 | | 5/2015 | | |

\* cited by examiner

SEMICONDUCTOR PROCESSING APPARATUS

CROSS-REFERENCES TO RELATED APPLICATIONS

This application is a national stage application of International Application No. PCT/CN2021/084860, filed on Apr. 1, 2021, which claims priority to Chinese Application No. 202020527685.6 filed on Apr. 10, 2020, the entire content of all of which are incorporated herein by reference.

TECHNICAL FIELD

The present disclosure generally relates to the semiconductor manufacturing field and, more particularly, to a semiconductor processing apparatus.

BACKGROUND

An atomic layer deposition (ALD) process and a chemical vapor deposition (CVD) process are widely used in the semiconductor processing field. However, when a semiconductor processing apparatus applied in the ALD and CVD processes performs processing on a hole and a groove with a difficult structure on a wafer or performs a same processing with a long processing time, for example, a thick film (thickness greater than 100 Å) needs to be deposited, the processing time is relatively long, and the productivity is relatively low.

SUMMARY

The present disclosure discloses a semiconductor processing apparatus, which can solve the problem that the productivity of the semiconductor processing apparatus is low.

In order to solve the above-mentioned problem, the present disclosure adopts the following technical solution.

Embodiments of the present disclosure disclose a semiconductor processing apparatus, which is configured to perform processing on a wafer. The semiconductor processing apparatus includes:
  a vacuum interlock chamber;
  a plurality of apparatus bodies, the apparatus body including a transfer platform, and at least two reaction chambers being arranged along a circumferential direction of the transfer platform; and
  a temporary storage channel, any two neighboring of the apparatus bodies being communicated through the temporary storage channel, and the temporary storage channel being configured to temporarily store the wafer, wherein:
    one of the plurality of apparatus bodies is connected to the vacuum interlock chamber, and the transfer platform transfers the wafer between the vacuum interlock chamber and the reaction chamber, between the temporary storage channel and the vacuum interlock chamber, and between the temporary storage channel and the reaction chamber.

The technical solution adopted in the present disclosure can achieve the following beneficial effects.

In the semiconductor processing apparatus disclosed in embodiments of the present disclosure, by adjusting the layout of the semiconductor processing apparatus, a plurality of apparatus bodies may be stacked and combined. That is, the two neighboring apparatus bodies may be communicated with each other using the temporary storage channel. Each apparatus body may include at least two reaction chambers. Compared with the existing that the processing module can only be arranged around a single transfer platform, the semiconductor processing apparatus with such a layout may effectively increase the number of reaction chambers, which may improve the productivity of the semiconductor processing apparatus and improve the product competitiveness of the semiconductor processing apparatus.

BRIEF DESCRIPTION OF THE DRAWINGS

In order to more clearly illustrate the technical solutions of embodiments or the background technology of the present disclosure, the accompanying drawings that need to be used in embodiments of background technology are briefly introduced below. Apparently, for those of ordinary skill in the art, other accompanying drawings may be obtained according to these accompanying drawings without creative efforts.

DETAILED DESCRIPTION OF THE EMBODIMENTS

In order to make the objectives, technical solutions, and advantages of the present disclosure clearer, the technical solutions of the present disclosure will be clearly and completely described below with reference to specific embodiments of the present disclosure and the corresponding drawings. Obviously, the described embodiments are only a part of embodiments of the present disclosure, but not all embodiments. Based on embodiments of the present disclosure, all other embodiments obtained by those of ordinary skill in the art without creative efforts shall be within the scope of the present disclosure.

The technical solutions disclosed in various embodiments of the present disclosure are described in detail below with reference to the accompanying drawings.

Figure 1:
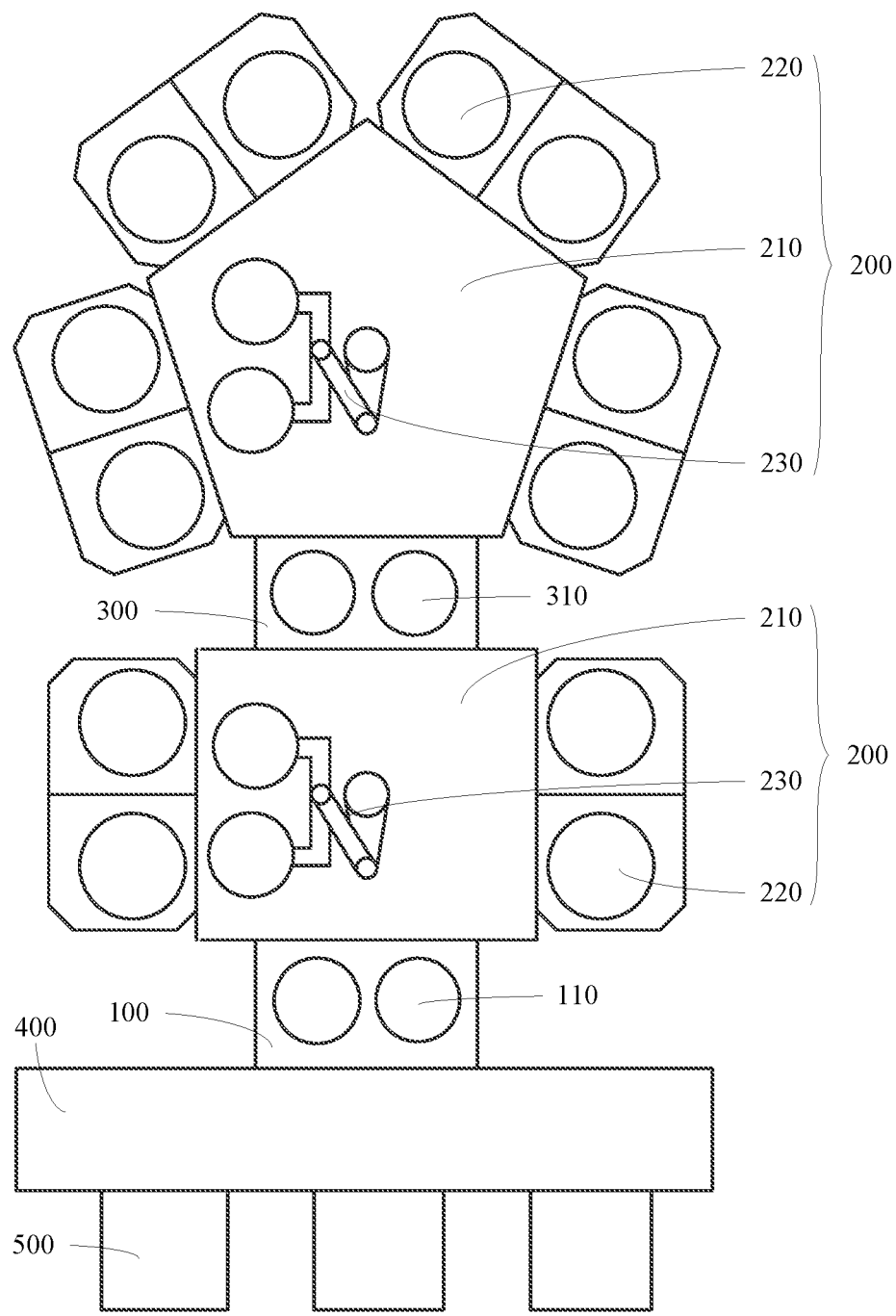
FIG. 1 is a schematic diagram of a semiconductor processing apparatus according to embodiments of the present disclosure.
Figure 2:
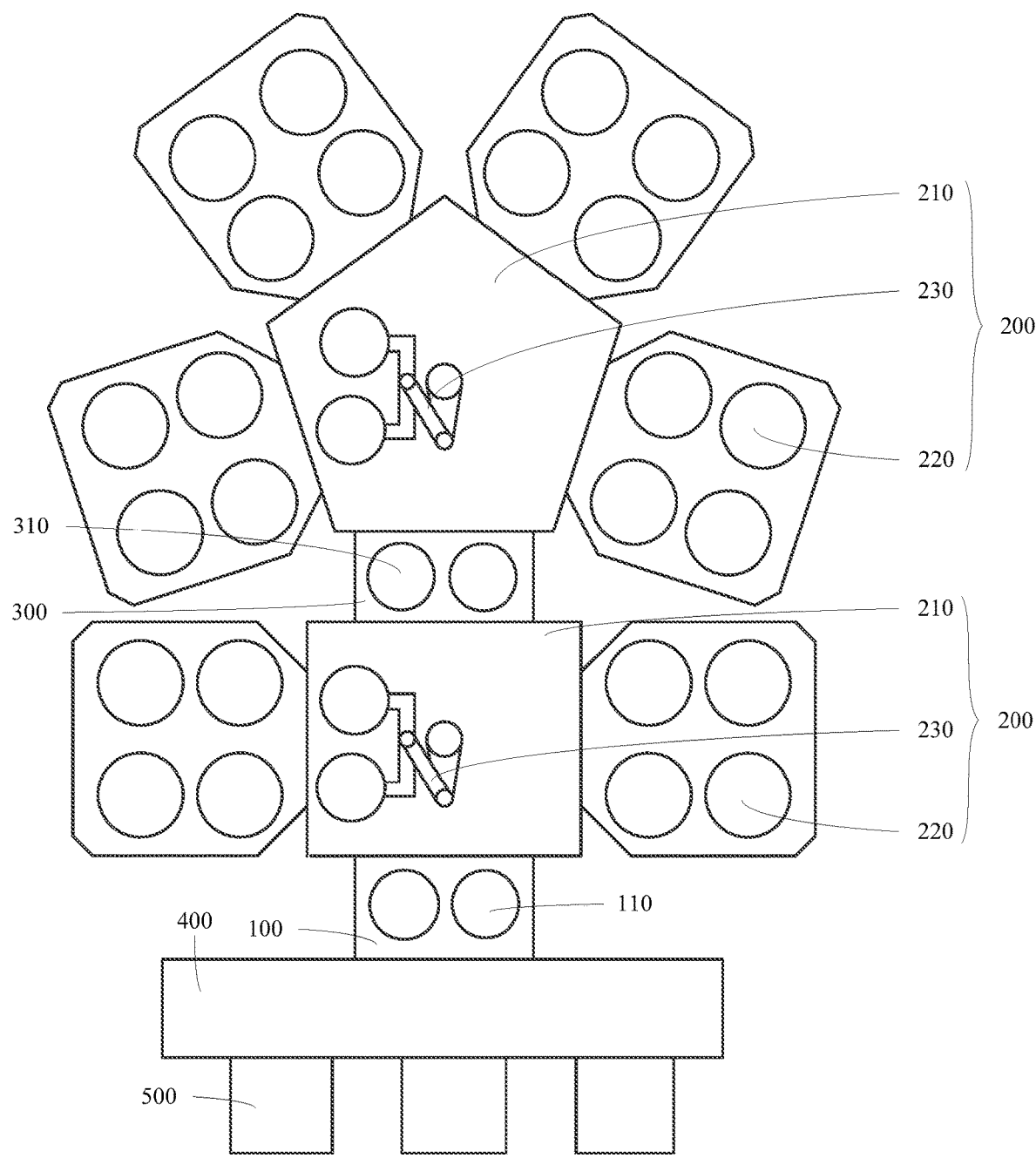
FIG. 2 is a schematic diagram of a semiconductor processing apparatus according to some other embodiments of the present disclosure.

With reference to FIG. 1 and FIG. 2, embodiments of the present disclosure disclose a semiconductor processing apparatus. The semiconductor processing apparatus may be configured to process a wafer. The disclosed semiconductor processing apparatus includes a vacuum interlock chamber 100, a plurality of apparatus bodies 200, and a temporary storage channel 300.

The vacuum interlock chamber (Load-Lock Chamber) 100 may realize a transition between a vacuum state and an atmospheric state. When the vacuum interlock chamber 100 is converted into the vacuum state, the wafer may be transferred into or out of the semiconductor processing apparatus that is in the vacuum state. That is, The vacuum interlock chamber 100 may be used as a transition chamber to realize temporary storage and transfer of the wafer, which facilitates the semiconductor processing apparatus to perform loading and unloading operations.

The temporary storage channel 300 may also be configured to temporarily store the wafer. The temporary storage channel 300 may be arranged between any two neighboring apparatus bodies 200. The temporary storage channel 300 may communicate with the two neighboring apparatus bodies 200 to cause a vacuum degree of the temporary storage channel 300 to be consistent with a vacuum degree inside the apparatus bodies 200. The wafer temporarily stored in the temporary storage channel structure 300 may be a wafer before processing or a wafer after processing. That is, the vacuum interlock chamber 100 and the temporary storage channel 300 may be transition modules for loading and unloading of the semiconductor processing apparatus, which facilitates the semiconductor processing apparatus to perform the loading and unloading operations.

An apparatus body 200 may include a transfer platform 210. At least two reaction chambers 220 may be arranged in a circumferential direction of the transfer platform 210. Specifically, the transfer platform 210 may be configured to transfer the wafer and complete the loading and unloading of the semiconductor processing apparatus. Specifically, the transfer platform 210 may have various manners to realize transfer of a to-be-processed workpiece. For example, the transfer platform 210 may be provided with a transfer device such as a manipulator. For example, the transfer platforms 210 shown in FIG. 1 each includes a manipulator 230. The manipulator 230 may realize the transfer of the to-be-processed workpiece in a grabbing manner. For another example, the transfer platform 210 may also use an adsorption manner (e.g., vacuum adsorption, magnetic adsorption, etc.) to realize the transfer of the to-be-processed workpiece. In a specific processing process, the wafer may be processed in the reaction chamber 220.

The plurality of apparatus bodies 200 may include a first apparatus body and a second apparatus body. The first apparatus body may include a first transfer platform. The first transfer platform may be connected to the vacuum interlock chamber 100. At least two first reaction chambers may be arranged in a circumferential direction of the first transfer platform. The second apparatus body may include a second transfer platform. The second transfer platform may be communicated with the first transfer platform through the temporary storage channel 300. At least two second reaction chambers may be arranged in a circumferential direction of the second transfer platform. The first transfer platform connected to the vacuum interlock chamber 100 may transfer the wafer between the vacuum interlock chamber 100 and the reaction chamber 220, between the temporary storage channel 300 and the vacuum interlock chamber 100, and between the temporary storage channel 300 and the reaction chamber 220. The second transfer platform not connected to the vacuum interlock chamber 100 may transfer the wafer between the temporary storage channel 300 and the reaction chamber 220. Thus, a loading and unloading cycle of the semiconductor processing apparatus may be implemented.

The first reaction chamber and the second reaction chamber may be core components for processing the wafer. The wafer may be processed in either the first reaction chamber or the second reaction chamber. It should be noted that the structures and processing principles of the first reaction chamber and the second reaction chamber are known technologies, which are not repeated here for the brevity of the specification.

In general, two or four first reaction chambers may form a first processing module. That is, one first processing module may generally include an even number of first reaction chambers. Of course, two or four second reaction chambers may form a second processing module. That is, one second processing module may generally include an even number of second reaction chambers.

In embodiments of the present disclosure, the first reaction chamber and the second reaction chamber may be a same wafer processing device, which is both the reaction chambers 220 described above. That is, the first reaction chamber and the second reaction chamber may have the same structures and processing principles to perform the same processing on the to-be-processed workpiece. In combination with the above, the first processing module and the second processing module may be the same processing module. In a process of designing the semiconductor processing apparatus, a plurality of different processing modules may not need to be designed, the processing module may only need to be repeatedly combined. Thus, modular design of the semiconductor processing apparatus may be realized, which facilitates design work of a designer, simplifies a design workload, and improves design efficiency of the semiconductor processing apparatus. Of course, the first reaction chamber and the second reaction chamber may be different wafer processing devices, which are not limited by embodiments of the present disclosure. It should be noted that the first transfer platform and the second transfer platform may both be the transfer platform 210 described above.

Similarly, it can be obtained that the first apparatus body and the second apparatus body may also be a same apparatus body and may be both the apparatus body 200 described above. In the process of designing the semiconductor processing apparatus, a plurality of different apparatus bodies may not need to be designed, and the apparatus body may only need to be repeatedly combined and communicated with each other through the temporary storage channel. Thus, the modular design degree of the semiconductor processing apparatus may be further improved, further facilitating the design work of the designer, simplifying the design workload, and improving the design efficiency of the semiconductor processing apparatus. Of course, the first apparatus body and the second apparatus body may also be designed as different apparatus bodies due to the actual working conditions and site limitations to cause the first apparatus body and the second apparatus body to meet the actual needs, which is not limited in embodiments of the present disclosure.

Specifically, one of the plurality of apparatus bodies 200 may be connected to the vacuum interlock chamber 100. That is, the first apparatus body may be connected to the vacuum interlock chamber 100. The wafer outside the semiconductor processing apparatus may enter the apparatus body 200 through the vacuum interlock chamber 100 for processing, or the wafer processed in the apparatus body 200 may be transferred out of the semiconductor processing apparatus through the vacuum interlock chamber 100 to realize the loading and unloading cycle of the semiconductor processing apparatus.

Any two neighboring apparatus bodies 200 may be communicated with each other through the temporary storage channel 300. The transfer platform 210 may be configured to transfer the wafer between the vacuum interlock chamber 100 and the reaction chamber 220, between the temporary storage channel 300 and the vacuum interlock chamber 100, and between the temporary storage channel 300 and the reaction chamber 220. Thus, the wafer may be transferred into the reaction chamber 220 for processing, or the processed wafer may be transferred out of the reaction chamber 220. That is, the temporary storage channel 300 may be arranged between the first apparatus body and the second apparatus body. The first transfer platform may be configured to transfer the wafer between the vacuum interlock chamber 100 and the first reaction chamber and between the temporary storage channel 300 and the vacuum interlock chamber 100. The second transfer platform may be configured to transfer the wafer between the temporary storage channel 300 and the second reaction chamber.

In the specific process of processing wafers by the semiconductor processing apparatus, the first transfer platform transfers the unprocessed wafers located in the vacuum interlock chamber 100 to the first reaction chamber, so that the first reaction chamber completes the wafer processing. At the same time, the first transfer platform can also transfer the processed wafers in the first reaction chamber to the vacuum interlock chamber 100 to complete the processing flow of one wafer.

Alternatively, the first transfer platform may be configured to transfer the unprocessed wafer in the vacuum interlock chamber 100 to the temporary storage channel 300. Then, the unprocessed wafer in the temporary storage channel 300 may be transferred to the second reaction chamber through the second transfer platform to cause the second reaction chamber to perform the process processing on the wafer. Then, the second transfer platform may transfer the processed wafer in the second reaction chamber to the temporary storage channel 300. The first transfer platform may then transfer the processed wafer in the temporary storage channel 300 to the vacuum interlock chamber 100 to complete a processing flow of one wafer.

In embodiments of the present disclosure, a number of the first apparatus body may be multiple, or a number of the second apparatus body may also be multiple. Of course, the number of the first apparatus body and the number of the second apparatus body may be multiple at the same time, which is not limited by embodiments of the present disclosure. A plurality of first apparatus bodies may be stacked and combined, or a plurality of second apparatus bodies may be stacked and combined. Of course, a plurality of first apparatus bodies and a plurality of second apparatus bodies may be mixed and stacked. Thus, the semiconductor processing apparatus may include many first reaction chambers or the second reaction chambers, which enables the semiconductor processing apparatus to process a plurality of wafers simultaneously, which further causes the semiconductor processing apparatus to have high productivity.

In the semiconductor processing apparatus disclosed in embodiments of the present disclosure, by adjusting the layout of the semiconductor processing apparatus, a plurality of apparatus bodies 200 may be stacked and combined. That is, the two neighboring apparatus bodies may be communicated with each other using the temporary storage channel. Each apparatus body may include at least two reaction chambers. Compared with the existing that the processing module can only be arranged around a single transfer platform, the semiconductor processing apparatus with such a layout may effectively increase the number of the reaction chambers, which may improve the productivity of the semiconductor processing apparatus and improve the product competitiveness of the semiconductor processing apparatus.

Generally, before the wafer is processed by the semiconductor processing apparatus, other processing processes may need to be performed. After the other processing processes are completed, the wafer cannot or may be difficult to be directly placed in the vacuum interlock chamber 100. Based on this, in an optional embodiment, the semiconductor processing apparatus may further include a semiconductor apparatus front-end module 400 and a wafer load port 500. The semiconductor apparatus front-end module 400 may include a conventional front end module of semiconductor apparatus (EFEM) currently on the market. The semiconductor apparatus front-end module 400 may be configured to efficiently transfer and position the wafer before the semiconductor processing apparatus processes the wafer. The wafer load port 500 may also include a conventional load port apparatus currently on the market. The specific structures and principles of the semiconductor apparatus front-end module 400 and the wafer load port 500 are known technologies, which are not repeated here for brevity.

Specifically, the semiconductor apparatus front end module 400 may include a wafer transfer manipulator. The wafer transfer manipulator may be configured to transfer the wafer between the vacuum interlock chamber 100 and the wafer load port 500. After the wafer is processed by other processing processes, the wafer may be placed in the wafer load port 500. Then, the wafer transfer manipulator may be configured to accurately transfer the wafer in the wafer load port 500 to the vacuum interlock chamber 100. The combined solution of the semiconductor apparatus front-end module 400 and the wafer load port 500 may realize the automatic loading and unloading of the wafer and may also ensure accuracy of the wafer loading and unloading and a speed of the wafer loading and unloading to make the semiconductor processing apparatus operate reliably and stably.

The processing of the wafer may need to be completed in a vacuum environment. In order to ensure that the semiconductor processing apparatus can have a good vacuum environment, in an optional embodiment, a temporary storage table 110 may be arranged in the vacuum interlock chamber 100. The temporary storage table 110 may be configured to temporarily store the wafer. One side of the vacuum interlock chamber 100 may be connected to the apparatus body 200. A first gate valve may be arranged at the connection between vacuum interlock chamber 100 and the apparatus body 200. The other side of the vacuum interlock chamber 100 may be connected to an external apparatus (e.g., a semiconductor apparatus front-end module 400). A second gate valve may be arranged at the connection between the vacuum interlock chamber and the external apparatus. It should be noted that the external apparatus mentioned here may refer to the external apparatus relative to the apparatus body 200. That is, the external apparatus mentioned here may be a component of the semiconductor processing apparatus.

During a specific loading process of the wafer, the first gate valve may be opened first. Thus, the wafer transfer manipulator may transfer the wafer in the wafer load port 500 to the temporary storage table 110. Then, the first gate valve may be closed. A vacuuming operation may be performed in the vacuum interlock chamber 100. When the vacuum interlock chamber 100 is in the vacuum environment, the second gate valve may be opened. Then, the transfer platform 210 may transfer the unprocessed wafer in the vacuum interlock chamber 100 to the reaction chamber 220 or the temporary storage channel 300 to realize the loading operation of the wafer. In a specific unloading process of the wafer, the vacuuming operation may be performed first in the vacuum interlock chamber 100. When the vacuum interlock chamber 100 is in the vacuum environment, the second gate valve may be opened. Then, the transfer platform 210 may transfer the processed wafer in the reaction chamber 220 or temporary storage channel 300 to the temporary storage table 110. Then, the second gate valve may be closed, and the first gate valve may be opened. Thus, the wafer transfer manipulator may transfer the wafer on the temporary storage table 110 to the wafer load port 500 to realize the unloading of the wafer.

In the loading and unloading operation, the first gate valve and the second gate valve may isolate the apparatus body 200 from the external apparatus to prevent the vacuum environment in the apparatus body 200 from being affected. Thus, the semiconductor processing apparatus may have a better vacuum environment for wafer processing to further improve the reliability of the semiconductor processing apparatus.

Since any two neighboring apparatus bodies 200 may be connected to each other through the temporary storage channel 300, that is, both sides of the temporary storage channel 300 may be connected to the first apparatus body and the second apparatus body, respectively, and since the first apparatus body and the second apparatus body are both in the vacuum environment, no gate valve may need to be arranged at the two sides of the temporary storage channel 300. Thus, the temporary storage channel 300 may be a communicated structure, which may reduce the time for opening or closing the gate valve to reduce the time for the loading and unloading of the wafer and have a positive effect on improving the productivity of the semiconductor processing apparatus.

Since the semiconductor processing apparatus may process many wafers simultaneously, the loading and unloading operation of the wafer may need to be performed quickly, or the simultaneous loading and unloading of a plurality of wafers may need to be realized. Meanwhile, the loading and unloading of the wafers may be performed simultaneously at the temporary storage table 110. Based on this, in an optional embodiment, a number of temporary storage tables 110 may be multiple. With a plurality of temporary storage tables 110, the speed of the loading and unloading operations of the wafers may be undoubtedly speeded up, and the loading and unloading of the plurality of wafers may be simultaneously realized to improve the loading and unloading speed of the semiconductor processing apparatus. Meanwhile, some of the temporary storage tables 110 may be used for loading, and the rest may be used for unloading, which prevents problems of interference or no available temporary storage table 110 for placing the wafer when the loading and unloading of the wafer are performed simultaneously at the temporary storage tables 110. Thus, the semiconductor processing apparatus may perform loading and unloading in a stable and orderly manner.

In an optional embodiment, the apparatus body 200 may further include a conveying mechanism 230. The conveying mechanism 230 may be arranged on the transfer platform 210. The conveying mechanism 230 may be configured to transfer the wafer. Specifically, the conveying mechanism 230 may be a manipulator. To further improve the loading and unloading speed of the semiconductor processing apparatus, in an optional embodiment, the manipulator may include at least two wafer grabbing devices. The at least two wafer grabbing devices may be configured to transfer at least two wafers simultaneously, which can undoubtedly achieve the above effect.

Further, the temporary storage channel 300 may include a plurality of wafer placement tables 310. The wafer placement tables 310 may be configured to temporarily store the wafers. The loading and unloading operations of the wafers may be undoubtedly speeded up by the plurality of wafer placement tables 310, the simultaneous loading and unloading of the plurality of wafers may be realized, and the loading and unloading speed of the semiconductor processing apparatus may be improved. Meanwhile, some wafer placement tables of the plurality of wafer placement tables 310 may be configured to load wafers, and the rest part may be configured to unload wafers, which prevents problems that interference occurs or no available wafer placement table 310 for placing the wafer when the wafer loading and unloading are performed at the wafer placement tables 310 simultaneously. Thus, the semiconductor processing apparatus may perform loading and unloading in a stable and orderly manner.

It should be noted that increasing the loading and unloading speed of the semiconductor processing apparatus may have a positive effect on increasing the productivity of the semiconductor processing apparatus. Therefore, increasing the loading and unloading speed of the semiconductor processing apparatus may also increase the productivity of the semiconductor processing apparatus.

Optionally, the transfer platform 210 may be a polygonal transfer platform. The conveying mechanism 230 may be arranged on the polygonal transfer platform. At least two reaction chambers 220 may be arranged in a circumferential direction of the polygonal transfer platform. Thus, the reaction chambers 220 may be regularly arranged at the polygonal transfer platform. The reaction chambers 220 may be regularly arranged around the transmission platform 210, which facilitates the designer to design.

Specifically, a shape of the transfer platform 210 may be quadrilateral, pentagonal, or hexagonal. According to the optimization calculation and the limitation of the on-site layout space, the transfer platform 210 of the shape may make the semiconductor processing apparatus have a compact layout. Thus, the structure of the semiconductor processing apparatus may be compact, which reduces a volume of the semiconductor processing apparatus, facilitates the layout and setting on an installation site, and improves utilization efficiency of on-site layout space. Further, the shape of the transfer platform 210 may be a regular quadrilateral, a regular pentagon, or a regular hexagon. Thus, the apparatus body 200 may be relatively symmetrical, and the structure of the semiconductor processing apparatus may be compact.

In order to further improve the regular arrangement of the reaction chambers 220, in an optional embodiment, at least two reaction chambers 220 may be arranged on at least one side of the transfer platform 210 to cause the reaction chambers 220 to be more regularly arranged.

In embodiments of the present disclosure, the plurality of apparatus bodies 200 may include a first apparatus body and a second apparatus body. The first apparatus body may be connected to the vacuum interlock chamber 100. The shape of the transfer platform 210 of the first apparatus body may be a regular quadrilateral, the shape of the transfer platform 210 of the second apparatus body may be a regular pentagon. With such a layout, the semiconductor processing apparatus may be further compactly arranged. Thus, the structure of the semiconductor processing apparatus may be more compact, and the volume of the semiconductor processing apparatus may further be reduced, which facilitates the layout and setting on the installation site and further improve the utilization efficiency of the on-site layout space.

Further, for the above-mentioned first apparatus body, when the shape of the transfer platform 210 is a polygon with even-numbered sides such as quadrilateral or hexgon, the vacuum interlock chamber 100 and the temporary storage channel 300 may be connected to the transfer platform 210 at positions corresponding to two opposite sides of the transfer platform 210, respectively. Thus, the vacuum interlock chamber 100 and the temporary storage channel 300 may be located on opposite sides of the first apparatus body. Therefore, the reaction chamber 220 may be arranged symmetrically. The transfer paths of the wafer to the symmetrical reaction chambers being the same may be easily realized.

As mentioned above, the wafer may be processed in the reaction chamber 220. Specifically, the reaction chamber 220 may be an atomic layer deposition (ALD) process chamber or a chemical vapor deposition (CVD) process chamber. Since an ALD process may have advantages of low-temperature deposition, high film purity, and better coverage. A CVD process may have advantages of simple process, environmental improvement, no pollution, less consumables, uniform and dense film formation, etc. The type of the process for processing the wafer may be not limited by embodiments of the present disclosure.

The above embodiments of the present disclosure mainly describe the differences between the various embodiments. As long as the different optimization features of the various embodiments are not contradictory, the different optimization features may be combined to form better embodiments, which are not repeated here for the brevity of the specification.

The above descriptions are merely embodiments of the present disclosure, which are not used to limit the present disclosure. For those skilled in the art, various modifications and variations may be made to the present disclosure. Any modification, equivalent replacement, improvement, etc. made within the spirit and principle of the present disclosure shall be included within the scope of the claims of the present application.

What is claimed is:

1. A semiconductor processing apparatus, configured to process a wafer, comprising:
   a vacuum interlock chamber;
   a plurality of apparatus bodies, one apparatus body of the plurality of apparatus bodies including a transfer platform, and at least two reaction chambers being arranged along a circumferential direction of the transfer platform; and
   a temporary storage channel, any two neighboring apparatus bodies of the plurality of apparatus bodies being communicated through the temporary storage channel, and the temporary storage channel being configured to temporarily store the wafer,
   wherein the transfer platform is configured to transfer the wafer between the vacuum interlock chamber and the at least two reaction chambers, between the temporary storage channel and the vacuum interlock chamber, and between the temporary storage channel and the at least two reaction chambers, and
   wherein the plurality of apparatus bodies includes:
     a first apparatus body connected to the vacuum interlock chamber, a shape of the transfer platform of the first apparatus body being a regular quadrilateral; and
     a second apparatus body, a shape of the transfer platform of the second apparatus body being a regular pentagon.

2. The semiconductor processing apparatus according to claim 1, wherein:
   a temporary storage table is arranged in the vacuum interlock chamber, and the temporary storage table is configured to temporarily store the wafer; and
   one side of the vacuum interlock chamber is connected to the first apparatus body, a first gate valve is arranged at connection between the vacuum interlock chamber and the first apparatus body, the other side of the vacuum interlock chamber is connected to an external apparatus, and a second gate valve is arranged at connection of the vacuum interlock chamber and the external apparatus.

3. The semiconductor processing apparatus according to claim 2, wherein a plurality of the temporary storage tables are included.

4. The semiconductor processing apparatus according to claim 1, wherein a shape of the transfer platform is a quadrilateral, a pentagon, or a hexagon.

5. The semiconductor processing apparatus according to claim 4, wherein the shape of the transfer platform is a regular quadrilateral, a regular pentagon, or a regular hexagon.

6. The semiconductor processing apparatus according to claim 4, wherein at least two reaction chambers are arranged on at least one side of the transfer platform.

7. The semiconductor processing apparatus according to claim 4, wherein:
   the shape of the transfer platform is the quadrilateral or the hexagon;
   the vacuum interlock chamber and the temporary storage channel are connected to the transfer platform at positions corresponding to two opposite sides of the transfer platform, respectively.

8. The semiconductor processing apparatus according to claim 1, wherein the apparatus body further includes:
   a conveying mechanism arranged on the transfer platform.

9. The semiconductor processing apparatus according to claim 8, wherein:
   the conveying mechanism is a manipulator, including at least two wafer grabbing devices.

10. The semiconductor processing apparatus according to claim 1, wherein:
    the temporary storage channel includes a plurality of wafer placement tables; and
    one wafer placement table of the plurality of wafer placement tables are configured to temporarily store wafers.

11. The semiconductor processing apparatus according to claim 1, wherein the reaction chamber includes an atomic layer deposition (ALD) process chamber or a chemical vapor deposition (CVD) process chamber.

* * * * *